US011073253B2

(12) United States Patent
Murakami

(10) Patent No.: US 11,073,253 B2
(45) Date of Patent: Jul. 27, 2021

(54) LIGHT EMISSION DEVICE AND ILLUMINATION DEVICE

(71) Applicant: Panasonic Intellectual Property Management Co., Ltd., Osaka (JP)

(72) Inventor: Kimihiro Murakami, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 223 days.

(21) Appl. No.: 16/217,420

(22) Filed: Dec. 12, 2018

(65) Prior Publication Data
US 2019/0113200 A1 Apr. 18, 2019

Related U.S. Application Data

(63) Continuation of application No. PCT/JP2017/026081, filed on Jul. 19, 2017.

(30) Foreign Application Priority Data

Jul. 29, 2016 (JP) .............................. JP2016-150753

(51) Int. Cl.
*F21S 41/675* (2018.01)
*H01S 5/022* (2021.01)
(Continued)

(52) U.S. Cl.
CPC ............... *F21S 41/675* (2018.01); *F21S 2/00* (2013.01); *F21S 41/16* (2018.01); *F21S 41/173* (2018.01);
(Continued)

(58) Field of Classification Search
CPC ...... F21S 41/675; F21S 41/173; F21S 41/635; F21S 41/365; F21S 41/16; F21S 41/37;
(Continued)

(56) References Cited

U.S. PATENT DOCUMENTS

2014/0029282 A1   1/2014  Ravier et al.
2015/0175054 A1*  6/2015  Yatsuda ................ F21S 41/255
                                                        362/465
(Continued)

FOREIGN PATENT DOCUMENTS

JP    2014-029858 A    2/2014
JP    2015-184591 A   10/2015

OTHER PUBLICATIONS

International Search Report issued in Application No. PCT/JP2017/026081 dated Oct. 10, 2017, with English ranslation.

*Primary Examiner* — Andrew J Coughlin
*Assistant Examiner* — Jessica M Apenteng
(74) *Attorney, Agent, or Firm* — McDermott Will & Emery LLP

(57) ABSTRACT

A light emission device includes a light source that emits an excitation light beam, a light deflector, a wavelength converter that receives and converts the excitation light beam deflected by the light deflector to wavelength-converted light, and a light concentration section that focuses the excitation light beam on the wavelength converter. The light concentration section includes a first optical system disposed between the light source and the light deflector, and a second optical system disposed between the light deflector and the wavelength converter. In the second optical system, a focal length of an Ay-axis is shorter than a focal length of an Ax-axis, where the Ax-axis is defined as an axis that has a lowest beam parameter product of the excitation light beam, and the Ay-axis is defined as an axis orthogonal to the Ax-axis in a cross section perpendicular to a propagation direction of the excitation light beam.

7 Claims, 9 Drawing Sheets

(51) Int. Cl.

| | | |
|---|---|---|
| *F21V 7/04* | (2006.01) | |
| *F21V 13/00* | (2006.01) | |
| *G02B 13/00* | (2006.01) | |
| *G02B 5/20* | (2006.01) | |
| *F21V 14/04* | (2006.01) | |
| *G02B 19/00* | (2006.01) | |
| *G02B 13/18* | (2006.01) | |
| *F21V 5/04* | (2006.01) | |
| *F21S 2/00* | (2016.01) | |
| *G02B 17/08* | (2006.01) | |
| *F21V 14/06* | (2006.01) | |
| *F21S 41/255* | (2018.01) | |
| *F21S 41/63* | (2018.01) | |
| *F21S 41/365* | (2018.01) | |
| *F21S 41/20* | (2018.01) | |
| *F21S 41/32* | (2018.01) | |
| *F21S 41/173* | (2018.01) | |
| *F21S 41/16* | (2018.01) | |
| *F21S 41/37* | (2018.01) | |
| *H01S 5/06* | (2006.01) | |
| *F21S 41/176* | (2018.01) | |
| *G02B 26/08* | (2006.01) | |

(52) U.S. Cl.
CPC ............ *F21S 41/255* (2018.01); *F21S 41/285* (2018.01); *F21S 41/321* (2018.01); *F21S 41/365* (2018.01); *F21S 41/37* (2018.01); *F21S 41/635* (2018.01); *F21V 5/04* (2013.01); *F21V 7/04* (2013.01); *F21V 13/00* (2013.01); *F21V 14/04* (2013.01); *F21V 14/06* (2013.01); *G02B 5/20* (2013.01); *G02B 13/00* (2013.01); *G02B 13/18* (2013.01); *G02B 17/08* (2013.01); *G02B 19/00* (2013.01); *H01S 5/022* (2013.01); *H01S 5/0609* (2013.01); *F21S 41/176* (2018.01); *G02B 26/0833* (2013.01)

(58) Field of Classification Search
CPC ...... F21S 41/255; F21S 41/321; F21S 41/285; F21S 2/00; F21V 5/04; F21V 7/04; F21V 13/00; F21V 14/04; F21V 14/06
USPC .......................................................... 362/510
See application file for complete search history.

(56) References Cited

U.S. PATENT DOCUMENTS

2018/0038558 A1\* 2/2018 Woisetschlaeger ....... F21K 9/69
2018/0142842 A1\* 5/2018 Schwaiger ................ F21V 7/04

\* cited by examiner

CORRESPONDING TILT ANGLE (°) OF MOVABLE MIRROR

CORRESPONDING TILT ANGLE (°) OF MOVABLE MIRROR

CORRESPONDING TILT ANGLE (°) OF MOVABLE MIRROR

LIGHT EMISSION DEVICE AND ILLUMINATION DEVICE

CROSS REFERENCE TO RELATED APPLICATIONS

This application is a U.S. continuation application of PCT International Patent Application Number PCT/JP2017/026081 filed on Jul. 19, 2017, claiming the benefit of priority of Japanese Patent Application Number 2016-150753 filed on Jul. 29, 2016, the entire contents of which are hereby incorporated by reference.

BACKGROUND

1. Technical Field

The present disclosure relates to (i) light emission devices in which a light source emits an excitation light beam on a wavelength converter which in turn generates light different from the excitation light beam, and (ii) illumination devices including the light emission device.

2. Description of the Related Art

Illumination devices using a laser light source such as a semiconductor light-emitting device (laser diode) are found in spotlights, headlights for cars, projectors, endoscopes, and the like. In these illumination devices, laser light with a wavelength of approximately 400 nm or 450 nm is radiated on a wavelength converter which consists of a fluorescent substance typically made of yttrium aluminium garnet (YAG). Fluorescent light generated by exciting the fluorescent substance, or emission light consisting of fluorescent light and scattered excitation light is used as illumination light. In such illumination devices, since the spot size of an excitation light beam on the fluorescent substance can be made smaller by using an optical concentration system, the size of the emission area produced by the fluorescent light can be reduced more than when using a light-emitting diode (LED). Accordingly, the size of the optical system for emitting light forward can be scaled down.

There is a light emission device that includes, besides a laser light source, an optical concentration system that focuses laser light, a wavelength converter consisting of fluorescent substance, and a light deflector disposed along the optical path from the laser light source to the wavelength converter. In this light emission device, laser light is focused on the fluorescent substance using the optical concentration system, and deflected by the light deflector. Moreover, the optical path of the laser light is cyclically deflected by causing the reflection mirror of the light deflector to pivot. Here, the cycle of the pivoting reflection mirror is configured at a degree short enough that the light from the light emission device is emitted as flickers imperceptible to the human eye. With this light emission devices one can freely alter the shape of the emission area on the fluorescent substance by cyclically changing the radiation point of the laser light thereon. By adding an optical system for projecting wavelength-converted light produced by the wavelength converter and scattered excitation light in the forward direction of the light emission device becomes an illumination device with a light distribution angle corresponding to the coordinate region of the excitation light beam scanned on the fluorescent substance. Hereinafter, this type of light emission device and illumination device are respectively also referred to as a scanning light emission device and scanning illumination device. The scanning illumination device can, for example, be used in an adaptive headlight system (ADB: Adaptive Driving Beam) for cars. To be specific, by cyclically controlling the angle of the inclinable reflection mirror, the laser light is scanned on a coordinate region of the fluorescent substance corresponding to the light distribution one wants to project. With this, for example, for the purpose of preventing glare on drivers in oncoming vehicles or pedestrians, the laser light is turned off when it passes through the coordinate region of the fluorescent substance corresponding to the region of the faces of the drivers or pedestrians so as to not radiate light thereon. In this manner, by changing the scanning region of the laser light on the fluorescent substance, light distribution adapted to the driving conditions of the car can be achieved.

In the scanning illumination device, the smaller the spot size of the excitation light beam scanned over the fluorescent substance is, the lower the light emission per unit area of the fluorescent substance becomes, and the front area of the device can be illuminated with a high-resolution image pattern (in other words, projection pattern) by controlling the position of the excitation light beam. Moreover, the size of the illumination device can be scaled down since the optical projection system can be configured smaller, the smaller the light emission area of the fluorescent substance is. Accordingly, a scanning illumination device with a smaller spot size that radiates light on a fluorescent substance and uses an optical concentration system is often proposed.

In Patent Literature (PTL) 1 (Japanese Unexamined Patent Application Publication No. 2014-29858), an exemplary configuration in which an optical concentration system is disposed between the light source and the light deflector is proposed. In PTL 2 (Japanese Unexamined Patent Application Publication No. 2015-184591), a convex lens for focusing the excitation light beam is disposed between the light deflector and the fluorescent substance.

SUMMARY

A high-output horizontal multimode laser light source is generally used in order to acquire a high enough luminous flux for illumination by exciting a fluorescent substance with a semiconductor laser. A horizontal multimode laser source is a laser light source in which multimode laser oscillation occurs along a slow axis (horizontal axis) and single-mode laser oscillation occurs along a fast axis perpendicular to the slow axis. When the laser light emitted from the horizontal multimode laser light source is focused by one axisymmetric lens, the problem arises that the spot diameter becomes larger due to the beam quality of the laser light being poorer along the slow axis, in which multimode laser oscillation occurs, than the fast axis, in which single-mode laser oscillation occurs.

A method to make the spot diameter on the fluorescent substance smaller along the slow axis is to shorten the focal length of the optical concentration system and disposing it near the fluorescent substance.

As the focal length of the optical concentration system becomes shorter, the optical path length from the light deflector to the fluorescent substance also becomes shorter when the optical concentration system is disposed between the light source and the light deflector as in the configuration stated in PTL 1, and the method is achieved. Accordingly, assuming the fluorescent substance is situated on a plane and the scan region of the excitation light beam has a fixed size, then the spot diameter on the fluorescent substance is enlarged without having enough excitation light focused due to the deviation ratio of the optical length growing larger according to the proximity to both edges of the scanned excitation light beam. Furthermore, the problem arises that when the optical system configuration has a large incidence angle on the fluorescent substance, the focus spot inclines greatly according to the proximity to both edges of the scanning point of the excitation light beam. In order to scan with a fixed length, the deflection angle of the light deflector needs to be widened. Thus, when the movable mirror is driven by a magnetic circuit, the thermal resistance of the coil due to the increase in electric current and the durability of the spring retaining the mirror may pose a problem. Moreover, widening the deflection angle of the light deflector increases the range (active range) in which the excitation light beam hits the optical elements along the scanned optical path, which in turn is connected to problems such as an increase in the dimensions of the device and the cost of its optical components.

However, when the optical concentration system is disposed between the light deflector and the fluorescent substance as in PTL 2, the displacement sensitivity (in other words, the displacement degree) of the deflection angle on the fluorescent substance is reduced since the beam curves toward the focal point of the optical concentration system due to a lens diffracting the deflected beam. Therefore, the deflection angle of the light deflector needs to be designed with a large angle, which is also connected to the above problem.

In order to solve the above problems, the present disclosure proposes an illumination device that enables sufficient excitation light to be adequately focused on the wavelength converter, and which includes a scanning light emission device that can be scaled down in size.

A light emission device according to an aspect of the present disclosure includes: a light source that emits an excitation light beam, a light deflector that deflects the excitation light beam, a wavelength converter that receives and converts the excitation light beam deflected by the light deflector to wavelength-converted light of a different wavelength and emits the wavelength-converted light, and a light concentration section that focuses the excitation light beam on the wavelength converter. The light concentration section includes a first optical system disposed between the light source and the light deflector, and a second optical system disposed between the light deflector and the wavelength converter. In the second optical system, a focal length of an Ay-axis is shorter than a focal length of an Ax-axis, where the Ax-axis is defined as an axis that has a lowest beam parameter product of the excitation light beam, and the Ay-axis is defined as an axis orthogonal to the Ax-axis in a cross section perpendicular to a propagation direction of the excitation light beam.

In the light emission device with this configuration, since the light focus of the second optical system is stronger along the Ay-axis than along the Ax-axis, the beam diameter can be made sufficiently small along the Ay-axis. Accordingly, the light deflector and the wavelength converter can be kept at a distance without influencing the beam diameter along the Ay-axis. With this, since the deflection angle of the light deflector can be decreased, it is possible to make the light deflector smaller and more durable. Moreover, widening and tilting of the spot at the end portions of the scanning region of the excitation light beam from the wavelength converter can be prevented.

Moreover, in the light emission device according to an aspect of the present disclosure, the second optical system may also include a cylindrical lens or a cylindrical mirror.

Because the light emission device has this configuration, the second optical system can freely adjust the beam diameter along the Ay-axis without influencing the beam diameter along the Ax-axis.

Moreover, in the light emission device according to an aspect of the present disclosure, combined focal lengths fx and fy with respect to the Ax- and Ay-axes of the light concentration section may also satisfy fx>fy.

The light emission device with this configuration uses the minimum beam size being proportional to the combined focal light of the light concentration section, and can make the spot along the Ay-axis, which becomes bigger due to its poor beam quality (BPP), smaller than the spot along the Ax-axis with good beam quality (BPP). Moreover, the wavelength converter can create an elliptic spot with a desired major-minor axis ratio (ellipticity) by suitably configuring each focal length of the optical concentration elements corresponding to the Ax-axis and Ay-axis.

Moreover, in the light emission device according to an aspect of the present disclosure, the excitation light beam may also be scanned on the wavelength converter along the Ax-axis.

In the light emission device with this configuration, the resolution of the image pattern obtained from scanning can be improved by scanning along the Ax-axis, whose beam diameter can be reduced more than along the Ay-axis. As a result, when using the light emission device as the illumination device, the sharpness (contrast) of the projection pattern improves. Moreover, since the second optical system, which lies between the light deflector and the fluorescent substance, has a weak light focus along the scan direction of the excitation light beam of the second optical system, a reduction in position sensitivity in the wavelength converter can be prevented.

Moreover, in the light emission device according to an aspect of the present disclosure, the excitation light beam is scanned on the wavelength converter along the Ax-axis and the Ay-axis, and may also be scanned over a wider angle along the Ax-axis than the Ay-axis.

In the light emission device with this configuration, a more detailed image pattern can be displayed by scanning along the Ax-axis with good beam quality than by scanning along the Ay-axis with poor beam quality. Moreover, the scanning direction can be aligned with the axis along which there is little influence from the second optical system by causing the second optical system, which is disposed between the wavelength converter and the light deflector, to scan over a wider angle along the Ax-axis with its weak light focus. Accordingly, a larger radiation area can be scanned along the Ax-axis without increasing the tilt angle of the light deflector.

Moreover, in the light emission device according to an aspect of the present disclosure, the wavelength converter may also be a fluorescent substance.

In the light emission device with this configuration, the wavelength of the excitation light beam can be converted by the fluorescent substance.

Moreover, the illumination device according to an aspect of the present disclosure includes: the above light emission device and an optical projection system for radiating on an illumination target (i) the wavelength-converted light emitted from the wavelength converter that receives the excitation light beam, and (ii) light scattered from the excitation light beam by the wavelength converter.

The illumination device with this configuration can be used for various types of illumination devices that require a specific light distribution, such as headlights for cars or spotlights, due to the excitation light beam being deflected by the light deflector and scanned over the wavelength converter. Furthermore, the illumination device with the present configuration can freely adjust its light distribution.

The present disclosure provides an illumination device that enables sufficient excitation light to be adequately focused on the wavelength converter, and includes a scanning light emission device that can be scaled down in size.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Figure 1:
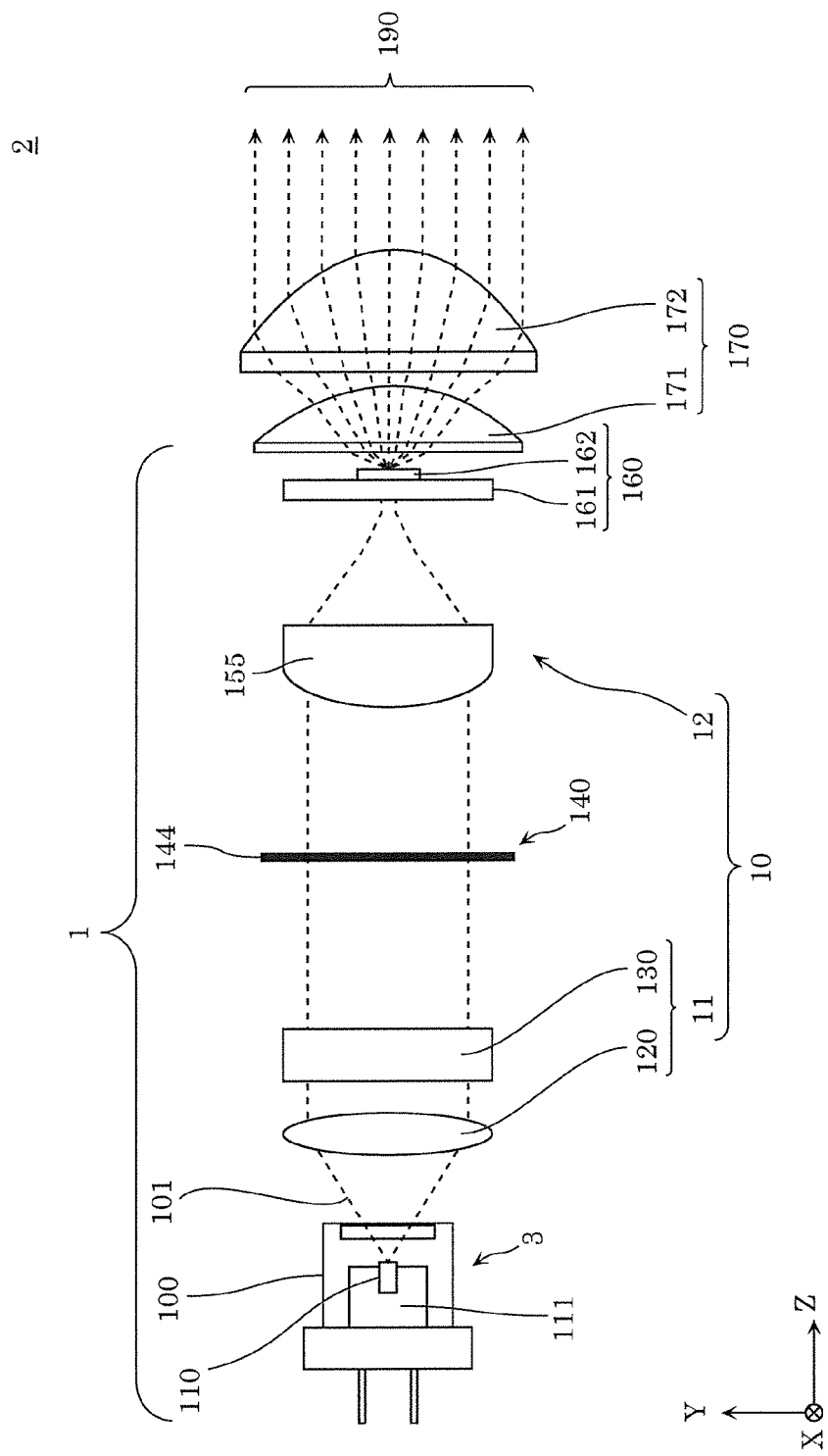
FIG. 1 is a lateral view showing an optical system configuration in its simplest form of a light emission device and an illumination device according to Embodiment 1.

Hereinafter, embodiments of the present disclosure will be described in detail. Note that each of the embodiments described below shows a specific example of the present disclosure. Numerical values, shapes, materials, components, placement and connection of the components, steps, the order of steps, and the like in the following embodiments are mere examples and are not intended to limit the present disclosure. Moreover, components in the following embodiments not mentioned in any of the independent claims that define the broadest concepts are described as optional elements.

Moreover, the drawings are schematic diagrams and do not necessarily provide strictly accurate illustrations. Therefore, the scales and the like in the drawings do not necessarily coincide.

Embodiment 1

Figure 2:
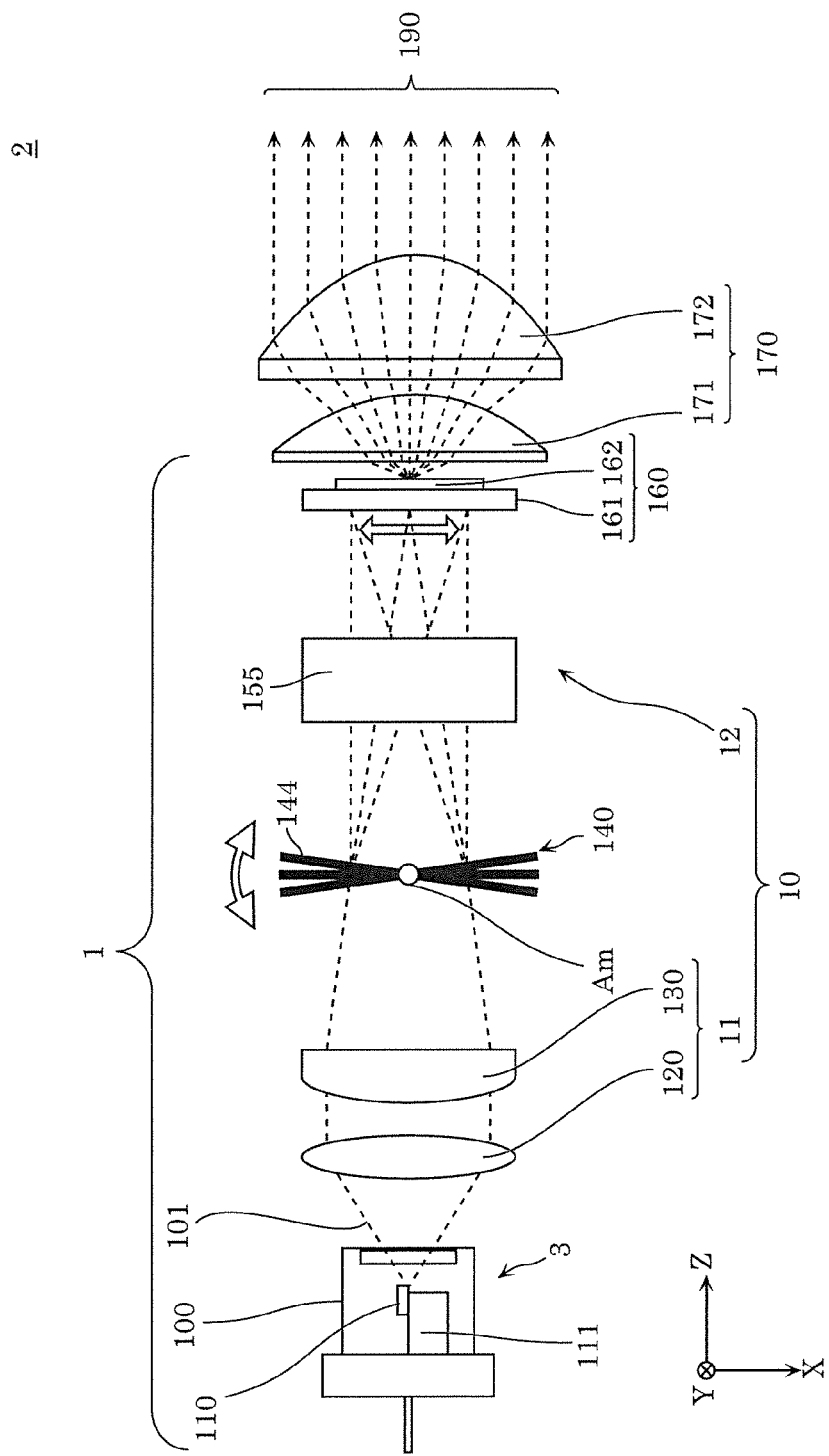
FIG. 2 is a top view showing the optical system configuration in its simplest form of the light emission device and the illumination device according to Embodiment 1.

FIGS. 1 and 2 are respectively a lateral view and top view showing an optical system configuration in its simplest form of light emission device 1 and illumination device 2 according to Embodiment 1. In FIGS. 1 and 2, the z-axis is an optical axis of projection light 190 projected from illumination device 2, and the x- and y-axes are perpendicular to the optical axis and intersect each other. Illumination device 2 according to the present embodiment is a device for emitting projection light 190, and includes, as illustrated in FIGS. 1 and 2, light emission device 1 and optical projection system 170. Light emission device 1 includes light source 3, light deflector 140, wavelength converter 160, and light concentration section 10.

Light source 3 emits excitation light beam 101, and includes semiconductor laser 100. Semiconductor laser 100 is a laser light source that emits excitation light beam 101. Semiconductor laser 100 mainly includes submount 111 and semiconductor light-emitting device 110 fixed thereto.

Semiconductor light-emitting device 110 is a semiconductor laser that emits excitation light beam 101 which is laser light. Hereinafter, semiconductor light-emitting device 110 will be described with reference to the drawings.

Figure 3:
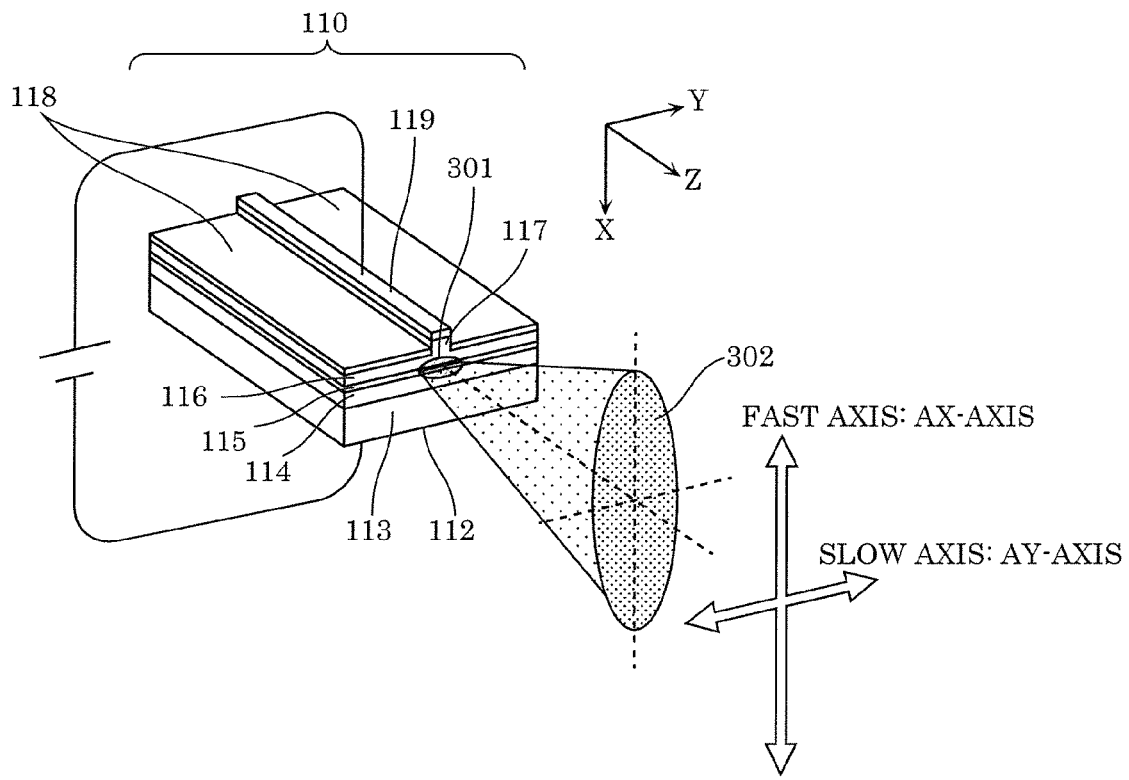
FIG. 3 is a perspective view showing a rough configuration of a semiconductor light-emitting device used in the light emission device, and a radiation pattern of laser light emitted from the semiconductor light-emitting device according to Embodiment 1.

FIG. 3 is a perspective view showing the rough configuration of semiconductor light-emitting device 110 used in light emission device 1, and the radiation pattern of the laser light emitted from semiconductor light-emitting device 110 according to the present embodiment. A three-dimensional coordinate system defined by x-, y-, and z-axes is illustrated in FIG. 3, but semiconductor light-emitting device 110 is mounted inside of semiconductor laser 100 with the three axes coinciding with those in FIGS. 1 and 2. When the x- and y-axes are parallel, semiconductor light-emitting device 110 may also be mounted pointing the other way around.

Hereinafter, a structure of semiconductor light-emitting device 110 will be described with reference to FIG. 3.

Semiconductor light-emitting device 110 is formed through epitaxial growth by layering n-type cladding layer 114 composed of Aluminium Gallium Nitride (AlGaN) and the like; active layer 115 of multiple quantum wells composed of Indium Gallium Nitride (InGaN) well layers, Gallium Nitride (GaN) barrier layers, and the like; and p-type cladding layer 116 composed of AlGaN and the like on semiconductor substrate 113 which is for example made of GaN. P-type cladding layer 116 includes ridge 117. Insulation layers 118 are disposed on a flat upper surface of p-type cladding layer 116, excluding ridge 117, and surfaces next to ridge 117. P-electrode 119 is disposed on an upper surface of ridge 117. A lower surface of semiconductor substrate 113 includes n-electrode 112.

N-electrode 112 and p-electrode 119 are formed through alloy deposition and the like using gold (Au) as a base. Stimulated emission of light occurs within a region of active layer 115 disposed below ridge 117 by applying a voltage to p-electrode 119 and n-electrode 112 allowing electric current to flow from p-electrode 119 to n-electrode 112. Since the refractive index of n-type cladding layer 114 and p-type cladding layer 116 is lower than the refractive index of active layer 115, which is thin, light gets confined therein. Moreover, p-electrode 119, which is disposed exterior to p-type cladding layer 116, is strip-shaped, and the flow of the electric current is limited to the strip of p-electrode 119 since insulation layers 118 are disposed in the other areas. As a result, the emission area is limited in size horizontally. The light generated in these horizontally and vertically limited spaces becomes amplified laser light due to the light reflecting countless of times on the front and back edge cleavages of active layer 115, and is emitted outward.

In the present embodiment, semiconductor laser 100 including semiconductor light-emitting device 110 emits blue laser light with a wavelength of approximately 450 nm. The area indicated with an ellipse below ridge 117 in FIG. 3 (area corresponding with near-field pattern 301 described later) is the emission area of the laser light. The axes perpendicular to and parallel with active layer 115 in semiconductor light-emitting device 110 are generally respectively called the fast axis and the slow axis, but at a position sufficiently close to the emission area of semiconductor light-emitting device 110, near-field pattern 301 is an ellipse with its major axis along the slow axis. However, after the laser light is emitted from active layer 115, the diameters of the slow and fast axes of the ellipse gradually grow larger due to diffraction. Here, the diameter of the fast axis grows considerably larger than the diameter of the slow axis. Accordingly, far-field pattern 302 is an ellipse with its major axis along the fast axis. Hereinafter, the fast and slow axes of the laser light will be respectively referred to as Ax-axis and Ay-axis.

In light emission device 1 according to the present embodiment, semiconductor light-emitting device 110 is fixed on top of submount 111 such that the direction of the x-, y-, and z-axes in FIG. 3 coincide with those in FIGS. 1 and 2. Here, the x- and y-axes may also point the other way around. In other words, the fast and slow axes of semiconductor light-emitting device 110 respectively run parallel with the x- and y-axes.

Excitation light beam 101 is focused along the fast and slow axes by light concentration section 10. With this, excitation light beam 101 is radiated on wavelength converter 160 with a beam spot proximate to the focal point which reproduces the shape of near-field pattern 301.

Light concentration section 10 includes first optical system 11 and second optical system 12. In the present embodiment, first optical system 11 includes aspheric lens 120 and cylindrical lens 130. Second optical system 12 includes cylindrical lens 155.

Aspheric lens 120 is a collimating lens that converts the laser light emitted from semiconductor light-emitting device 110 to collimated light, and is optimized to keep spherical aberration thereof at an absolute minimum.

Cylindrical lens 130 is curved along the fast axis of semiconductor light-emitting device 110, and has its focal point on wavelength converter 160.

Cylindrical lens 155 is curved along the slow axis of semiconductor light-emitting device 110, and is a lens with its focal point on wavelength converter 160.

For example, excitation light beam 101 is collimated by aspheric lens 120 disposed proximate to semiconductor laser 100. Subsequently, excitation light beam 101 is focused along the fast axis by cylindrical lens 130 disposed between semiconductor laser 100 and light deflector 140. Furthermore, excitation light beam 101 is focused along the slow axis by cylindrical lens 155 disposed between light deflector 140 and wavelength converter 160, after being deflected by light deflector 140. Moreover, since cylindrical lenses 130 and 155, whose focal lengths differ from each other, are disposed such that their focal points are on the same position on wavelength converter 160, excitation light beam 101 is radiated on wavelength converter 160 with a beam spot proximate to the focal point which reproduces the shape of near-field pattern 301.

Light deflector 140 is an instrument for deflecting excitation light beam 101. Light deflector 140 includes one optical deflection element 144 on which excitation light beam 101 is incident along a predetermined optical axis. In the present embodiment, optical deflection element 144 is, for example, a light-transmissive optical element that deflects the incident light while being cyclically tilted back and forth about rotation axis Am by a magnetic circuit. For example, a light-transmissive prism or acousto-optic element that relies on diffraction can be used for optical deflection element 144. Note that in the present embodiment, light deflector 140 includes light-transmissive optical deflection element 144, but may also include a reflective movable mirror that is tilted back and forth by a magnetic circuit or piezoelectricity.

Wavelength converter 160 receives and converts excitation light beam 101 deflected by light deflector 140 to wavelength-converted light of a different wavelength, and emits the wavelength-converted light. In the present embodiment, wavelength converter 160 includes fluorescent substance 162 and transparent substrate 161 that is laminated on the surface thereof. Fluorescent substance 162 converts excitation light beam 101 to fluorescent light, which is wavelength-converted light. Fluorescent substance 162 includes, for example, a YAG fluorescent substance that is a crystalline garnet fluorescent substance, which is represented by the formula Ce-doped $A_3B_5O_{12}$. (A including one of Sc, Y, Sm, Gd, Tb, and Lu. B including one of Al, Ga, and In.) To be more specific, besides a Ce-doped $Y_3Al_5O_{12}$ single crystal, a Ce-doped $Y_3Al_5O_{12}$ polycrystal, or a ceramic YAG fluorescent substance mix of sintered Ce-doped $Y_3Al_5O_{19}$ and $Al_2O_3$ particles may also be used for fluorescent substance 162.

Optical projection system 170 is an optical system for radiating on an illumination target (i) wavelength-converted light emitted from wavelength converter 160 that receives excitation light beam 101, and (ii) light scattered from excitation light beam 101 by wavelength converter 160. In the present embodiment, optical projection system 170 is a lens for focusing and projecting (i) the wavelength-converted light (fluorescent light) emitted with a Lambertian distribution from wavelength converter 160, and (ii) the scattered light from excitation light beam 101. In the present embodiment, optical projection system 170 includes first lens 171 and second lens 172. Optical projection system 170 including two lenses, first lens 171 and second lens 172, is disposed such that their combined focal point coincides on the surface of the fluorescent substance. With this, optical projection system 170 can project collimated light.

Next, the optical path of excitation light beam 101 to fluorescent substance 162 of wavelength converter 160 will be described with reference to FIGS. 1 and 2.

Excitation light beam 101 emitted from semiconductor laser 100 is incident on aspheric lens 120 disposed closely in front thereof, and is converted to collimated light. Next, excitation light beam 101 is incident on cylindrical lens 130 curved along the x-axis (fast axis of semiconductor light-emitting device 110), and excitation light beam 101 is converted to convergent light along the fast axis. Since excitation light beam 101 is not influenced by cylindrical lens 130 along its slow axis, excitation light beam 101 propagates as collimated light. Subsequently, excitation light beam 101 is incident on light deflector 140. The excitation light beam whose propagation direction is changed by light deflector 140, is incident on cylindrical lens 155 disposed along the deflection direction. Since cylindrical lens 155 is curved along the slow axis (y-axis), cylindrical lens 155 converts collimated excitation light beam 101 to convergent light therealong. Here, excitation light beam 101 is not influenced by cylindrical lens 155 along the fast axis, and propagates to wavelength converter 160 at the same convergence angle as when converted by cylindrical lens 130. Excitation light beam 101 converted to convergent light by cylindrical lenses 130 and 155 passes through transparent substrate 161, onto which fluorescent substance 162 is laminated, and is incident on fluorescent substance 162 disposed proximate to the focal point of each cylindrical lens.

Fluorescent substance 162 partially converts excitation light beam 101 to fluorescent light that is wavelength-converted light with a broader wavelength distribution, and emits the fluorescent light outward. Moreover, the remaining light of excitation light beam 101 that is not converted to the fluorescent light is also scattered by fluorescent substance particles and fluorescent substance binder in fluorescent substance 162, as well as particles mixed into fluorescent substance 162 when necessary, and is emitted to the outside thereof. The fluorescent light and the scattered light from excitation light beam 101 is emitted perpendicularly with respect to the surface of transparent substrate 161 that includes the fluorescent substance (surface facing optical projection system 170) with a Lambertian distribution. Since people perceive the mix of fluorescent light and scattered light from excitation light beam 101 entering their eyes as light with a color depending on the ratio between fluorescent light and scattered light, the wavelength distribution of white light or any preferred color can be created by suitably adjusting the ratio to the thickness of the fluorescent substance, the density of the fluorescent substance particles, and/or the like.

Figure 4:
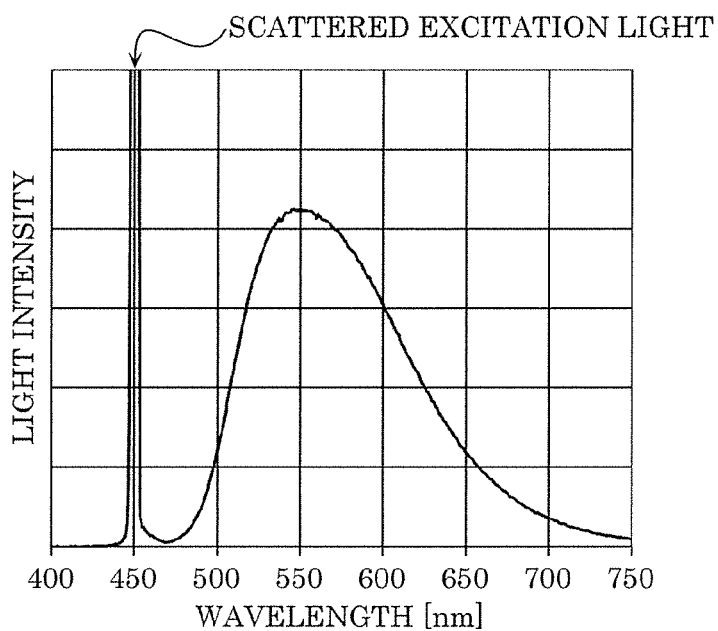
FIG. 4 is a graph showing a wavelength distribution of light emitted outward from a fluorescent substance according to Embodiment 1.

FIG. 4 is a graph showing the wavelength distribution of light emitted outward from fluorescent substance 162 according to the present embodiment. In the present embodiment, blue light with a wavelength of approximately 450 nm is used for excitation light beam 101, and a YAG fluorescent substance that emits yellow fluorescent light excited with excitation light beam 101 is used for fluorescent substance 162. In FIG. 4, the presence of a peak in light intensity around the wavelength of 450 nm is due to the scattered light from excitation light beam 101 not being converted to fluorescent light by fluorescent substance 162. The wavelengths longer than the wavelengths around the peak indicate the light intensity of the light converted to fluorescent light by fluorescent substance 162. The light of the spectral distribution shown in FIG. 4 is perceived by people as white light.

Note that in the present embodiment, one of the surfaces of transparent substrate 161, on which fluorescent substance 162 is disposed, is coated with a dichroic film that reflects visible light outside the wavelength range of excitation light beam 101 in order to improve luminous efficacy, because excitation light beam 101 is radiated from the opposite side of the fluorescent light emission surface of fluorescent substance 162 (surface facing optical projection system 17W.

Furthermore, in order to use light emission device 1 for illumination device 2, optical projection system 170, whose combined focal point is the center of fluorescent substance 162, is disposed therebehind with respect to the projection direction. By scanning excitation light beam 101 over fluorescent substance 162, the fluorescent light emitted from the fluorescent substance with a Lambertian distribution and the scattered light from excitation light beam 101 is incident on optical projection system 170, and is mixed and projected in the forward direction of the device. With this, white light mixed from the fluorescent light and the excitation light can be projected.

Note that in order to have as much emission light from fluorescent substance 162 as possible incident on optical projection system 170, optical projection system 170 is designed to maintain a Numerical Aperture (NA) of 0.9 or more.

Projection light 190 emitted from optical projection system 170 will be described with reference to the drawings.

Figure 5A:
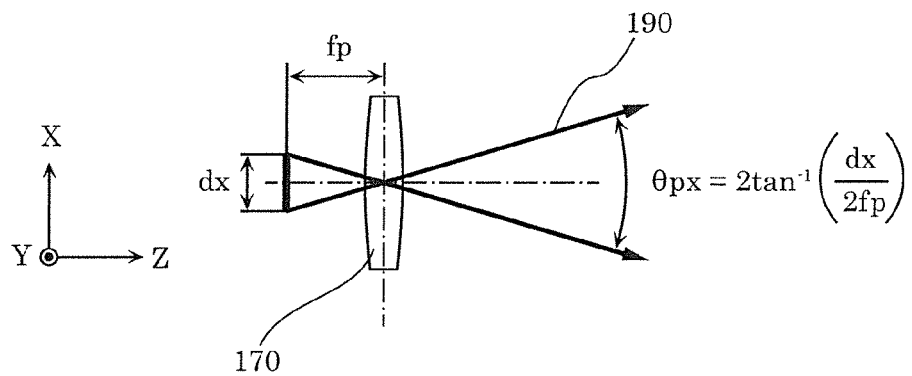
FIG. 5A shows a relationship between a focal length of an optical projection system and a radiation angle along an x-axis of projection light according to Embodiment 1.
Figure 5B:
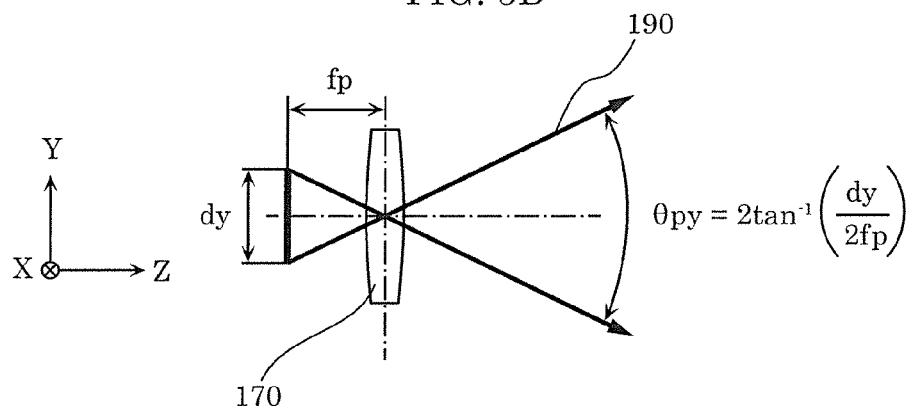
FIG. 5B shows the relationship between the focal length of the optical projection system and the radiation angle along a y-axis of the projection light according to Embodiment 1.

FIGS. 5A and 5B show the relationship between focal length fp of optical projection system 170 and, respectively, radiation angles θpx and θpy along the x- and y-axes of projection light 190 according to the present embodiment. In FIGS. 5A and 5B, optical projection system 170 is illustrated simplified as one lens.

As illustrated in FIGS. 5A and 5B, when the focal length of optical projection system 170 is fp and light emission widths along the x- and y-axes of fluorescent substance 162, which is disposed on the focal point of optical projection system 170, are dx and dy, radiation angles θpx and θpy of projection light 190 projected frontward are both expressed as below:

[Math. 1]
$$\theta_{px} = 2\tan^{-1}\left(\frac{dx}{2fp}\right) \qquad \text{Expression (Expr.) 1-1}$$

[Math. 2]
$$\theta_{py} = 2\tan^{-1}\left(\frac{dy}{2fp}\right) \qquad \text{Expr. 1-2}$$

When light emission device 1 and illumination device 2 according to the present embodiment respectively function as a scanning light emission device and a scanning illumination device, optical deflection element 144, on which excitation light beam 101 is incident, cyclically rotates back and forth within a fixed angle range about rotation axis Am illustrated in FIG. 2. Consequently, excitation light beam 101 is scanned over the surface of fluorescent substance 162 along the x-axis while its propagation direction is changed depending on the tilt angle of optical deflection element 144. Here, the light emission width, with respect to the radiation angle range required for illumination device 2, that is, the scan range, can be determined based on Expr. 1-1 and Expr. 1-2.

Figure 6A:
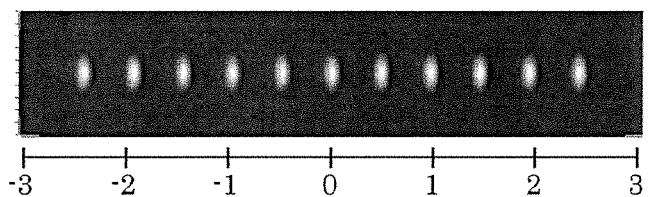
FIG. 6A shows a first example of positions and shapes of an excitation light beam on an incidence surface of the fluorescent substance in the light emission device according to Embodiment 1.
Figure 6B:
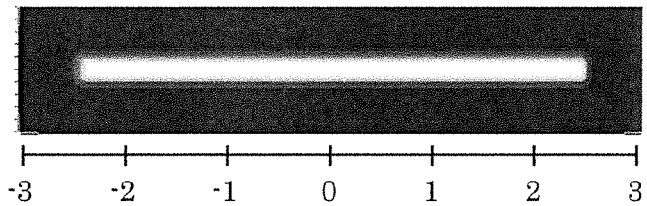
FIG. 6B shows a second example of the positions and shapes of the excitation light beam on the incidence surface of the fluorescent substance in the light emission device according to Embodiment 1.
Figure 6C:
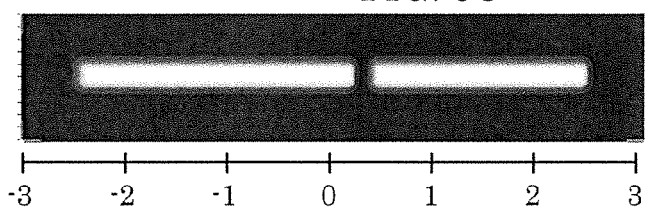
FIG. 6C shows a third example of the positions and shapes of the excitation light beam on the incidence surface of the fluorescent substance in the light emission device according to Embodiment 1.

FIGS. 6A to 6C respectively show the first to third examples of the positions and shapes of excitation light beam 101 on the incidence surface of fluorescent substance 162 in light emission device 1 according to the present embodiment. In FIGS. 6A to 6C, the white areas illustrate the radiation spots or radiation areas of excitation light beam 101. FIG. 6A shows an example of the change in radiation spot position of excitation light beam 101 with respect to the rotation angle of optical deflection element 144. FIG. 6B shows the shape of the radiation area of excitation light beam 101 when its radiation spot, which moves back and forth due to optical deflection element 144 rapidly tilting back and forth, is superimposed over time in a state in which semiconductor laser 100 is uninterruptedly turned on. In other words, FIG. 6B shows the excitation area created by excitation light beam 101. FIG. 6C is an example illustrating a state in which the possible scan area (area corresponding to excitation area in FIG. 6B) of excitation light beam 101 on fluorescent substance 162 is partially not excited (in other words, state in which light emission device 1 is turned off) by temporarily suspending light emission of semiconductor laser 100 in synchronization with the tilting (rotation) operation of optical deflection element 144. In this manner, a non-emission area can be created on fluorescent substance 162 by controlling the ON/OFF of the semiconductor laser in synchronization with the tilting operation of optical deflection element 144. Furthermore, adjustable light distribution like ADB can be achieved when the frontward angle range corresponding to the non-emission area becomes the non-radiation area by using Expr. 1-1 and Expr. 1-2.

Hereinafter, the advantageous effects produced by light emission device 1 and illumination device 2 according to the present embodiment will be described.

Generally speaking, when the beam parameter products (BPP), which indicate the beam quality of the laser light, along the x- and y-axes are respectively BPPx and BPPy, the divergence angles (double angle) are θx (mrad) and θy (mrad), and the beam waist radii are rx (mm) and ry (mm), then the BPP is defined as follows:

[Math. 3]

$$BPPx = \frac{rx \times \theta x}{2} \qquad \text{Expr. 2-1}$$

[Math. 4]

$$BPPy = \frac{ry \times \theta y}{2} \qquad \text{Expr. 2-2}$$

This BPP is a conserved quantity and does not change when assuming the light is transmitted through a perfect optical system without aberration.

Moreover, when the focal length of cylindrical lens 130 is fx, the focal length of cylindrical lens 155 is fy, the incident beam diameter along the x- and y-axes (in other words, the fast and slow axes) are respectively Dx and Dy, and the BPPs indicating the beam quality along the x- and y-axes are respectively BPPx and BPPy, then spot diameters dx and dy along each axis of the beam waist are defined as follows if the optical system, such as a lens, has no aberration:

[Math. 5]

$$dx = 4fx \times \frac{BPP_x}{Dx} \qquad \text{Expr. 3-1}$$

[Math. 6]

$$dy = 4fy \times \frac{BPP_y}{Dy} \qquad \text{Expr. 3-2}$$

From these expressions, it can be understood that the beam waist spot diameter is proportional to the beam quality and the focal lengths of the focus lenses.

The laser of semiconductor light-emitting device 110, which is a high-output semiconductor laser used in the present embodiment, oscillates in a single mode along the fast axis which runs along thickness of active layer 115, and in multiple modes along the slow axis in which the optical confinement is larger than the thickness of active layer 115. Accordingly, excitation light beam 101 has a far-field pattern satisfying θx>θy due to the effects of diffraction. Moreover, due to the influence of the oscillation modes, BPPx<BPPy. In other words, the fast axis is the Ax-axis with good beam quality and the slow axis is the Ay-axis with poor beam quality. However, excitation light beam 101 emitted from semiconductor light-emitting device 110 is converted to collimated light by aspheric lens 120 which is an axisymmetric collimating lens. Accordingly, the incident beam diameter on cylindrical lens 130 is proportional to θx and θy, and satisfies Dx>Dy. Therefore, (BPPx/Dx)<(BPPy/Dy), and assuming that this beam is made narrower by one axisymmetric lens in which focal lengths fx=fy, then the relationship between spot diameters dx and dy in Expr. 3-1 and Expr. 3-2 becomes dx<dy and the beam diameter ratio is constant.

Since (BPPy/Dy) of a multimode semiconductor laser is generally several times or tens of times more than (BPPx/Dx), the light focus along the fast axis is much better compared to that of the slow axis. Assuming that even when fx>fy by dividing the optical concentration system along two axes, it is difficult to reverse the size relationship between spot diameters dx and dy due to limitation of space in the device. Therefore, when scanning in one dimension, a more detailed image pattern can be displayed by scanning along the Ax-axis with good beam quality, in other words, the x-axis, than by scanning along the Ay-axis with poor beam quality. In other words, the resolution of the image pattern obtained from scanning can be improved by scanning along the Ax-axis, whose beam diameter can be reduced more than along the Ay-axis. As a result, when using light emission device 1 as illumination device 2, the sharpness (contrast) of the projection pattern improves. Moreover, since second optical system 12, which lies between light deflector 140 and fluorescent substance 162, has a weak light focus along the scan direction of excitation light beam 101 of second optical system 12, a reduction in position sensitivity in wavelength converter 160 can be prevented.

In regard to this, when excitation light beam 101 is scanned in one dimension and is incident on fluorescent substance 162 at a large angle from the non-scanning direction, or when excitation light beam 101 is scanned in two dimensions to enhance the resolution of each direction perpendicular to each other, there are cases where not only the spot diameter along the Ay-axis with poor beam quality, but also the spot diameter along the Ax-axis with good beam quality needs to be made smaller. In order to achieve this, when making the Ay-axis with poor beam quality more narrow using a configuration in which the light is focused with one axisymmetric lens, it is necessary to shorten the focal length of the lens and to place it as closely as possible to the fluorescent substance. Here, there are two possible placement configurations concerning the spatial relationship between the lens and the light deflector. One is a configuration in which the lens is disposed between the light source and the light deflector. The other is a configuration in which the lens is disposed between the light deflector and the fluorescent substance.

When using the former configuration, it is necessary to shorten the focal length of the lens, and also to reduce the distance between the light deflector and the fluorescent substance accordingly. As a result, in order to maintain a fixed scanning range on the fluorescent substance, the deflection angle of the light deflector needs to be increased, and a problem arise with the durability of the coils, springs, and the like in the light deflector. Moreover, since spot blur becomes more obvious at the edges of the scanned beam during the back and forth scanning, for example, it is difficult to bring the lens closer to the fluorescent substance to a large degree.

In contrast, when using the latter configuration, the deflected excitation light beam curves back to the focal point by having the excitation light beam incident on a lens with ample light focus in the same direction as the deflection direction in order to focus the excitation light beam deflected by the deflector on the fluorescent substance. Accordingly, spot displacement sensitivity of the excitation light beam on the fluorescent substance with respect to the deflection angle is reduced. Thus, the excitation light beam needs to be deflected by the light deflector at a larger angle, and the same problem as the former configuration arises.

In order to solve these problems, light emission device 1 according to the present embodiment includes two cylindrical lenses that are curved along only one of two axes perpendicular thereto for focusing excitation light beam 101. The first lens, cylindrical lens 130 with focal length fx along the x-axis, is disposed between light source 3 and light deflector 140. The second lens, cylindrical lens 155 with focal length fy along the y-axis, is disposed between light deflector 140 and wavelength converter 160. Since excitation light beam 101 has a focal point on fluorescent substance 162 of wavelength converter 160 along both the x-axis and the y-axis, fx>fy. Cylindrical lens 130 focuses excitation light beam 101 along the Ax-axis with good beam quality and cylindrical lens 155 focuses excitation light beam 101 along the Ay-axis with poor beam quality. As a result, the problem with the configuration in which the light is focused with one axisymmetric lens as stated above is solved, and the excitation light beam spot can also be made smaller along the Ay-axis. Note that wavelength converter 160 can create an elliptic spot with a desired major-minor axis ratio (ellipticity) by suitably configuring each focal length of the optical concentration elements corresponding to the Ax-axis and Ay-axis.

Moreover, the scanning direction can be aligned with the axis along which there is little influence from second optical system 12 by causing second optical system 12, which is disposed between wavelength converter 160 and light deflector 140, to scan over a wider angle along the Ax-axis with its weak light focus. Accordingly, a larger radiation area can be scanned along the Ax-axis without increasing the tilt angle of light deflector 140.

Moreover, since the beam quality along the Ax-axis of semiconductor light-emitting device 110 oscillating in multiple modes is far better than the beam quality along the Ay-axis, the spot diameter along the Ax-axis can be made smaller than the spot diameter along the Ay-axis even when the focal length to fluorescent substance 162 becomes slightly longer. In the present embodiment, cylindrical lenses 130 and 155 with focal lengths fx and fy are used which satisfy these conditions.

As described above, in light emission device 1 according to the present embodiment, focal length fy of second optical system 12 along the Ay-axis is shorter than the focal length (unlimited) along its Ax-axis. In this manner, since the light focus of second optical system 12 is stronger along the Ay-axis than along the Ax-axis, the beam diameter can be made sufficiently small along the Ay-axis. Thus, light deflector 140 and wavelength converter 160 can be kept at a distance without influencing the beam diameter along the Ay-axis. With this, since the deflection angle of light deflector 140 can be decreased, it is possible to make light deflector 140 smaller and more durable. Moreover, widening and tilting of the spot at the end portions of the scanning region of excitation light beam 101 from wavelength converter 160 can be prevented. Note that in the above example, one optical concentration element is used to focus the light along the Ax- and Ay-axes, but two or more optical concentration elements may also be used. In this case, combined focal lengths of the two or more optical concentration elements may be used for focal lengths fx and fy along the Ax- and Ay-axes.

Moreover, illumination device 2 according to the present embodiment can be used for various types of illumination devices that require a specific light distribution, such as headlights for cars or spotlights, due to excitation light beam 101 being deflected by light deflector 140 and scanned over wavelength converter 160. Furthermore, illumination device 2 can freely adjust its light distribution.

Note that in the present embodiment, second optical system 12 includes cylindrical lens 155, but may also include a cylindrical mirror. Because second optical system 12 includes a cylindrical lens or cylindrical mirror, second optical system 12 can freely adjust the beam diameter along the Ay-axis without influencing the beam diameter along the Ax-axis.

Note that when the above configuration of cylindrical lenses 130 and 155 is used in the light emission device, which scans excitation light beam 101 in two dimensions, excitation light beam 101 is also scanned along the Ay-axis. In this case, spot displacement sensitivity on fluorescent substance 162 with respect to the deflection angle of light deflector 140 is reduced due to the scan direction coinciding with the curvature of cylindrical lens 155 disposed between light deflector 140 and wavelength converter 160. Although this makes the scan range more narrow along the Ay-axis, the current configuration is very useful for enhancing the resolution of the excitation light beam. For example when using ADB, it is better for the radiation angle range, in other words, the scan range of the fluorescent substance to be narrow along the Ay-axis since the area in front of the car should be illuminated at a wider angle vertically rather than horizontally.

Moreover, in the present embodiment, blue light with a wavelength around 450 nm is used for the excitation light beam from semiconductor light-emitting device 110, but as long as the wavelength of the light is within the excitation wavelength range of fluorescent substance 162, visible light of a different wavelength or ultraviolet light may also be used. However, when using ultraviolet light, it is necessary to generate the visible spectrum in line with the required specifications of illumination device 2 using only fluorescent light. Accordingly, when multiple wavelength distributions are necessary for generating the spectrum, a mix or layers of two or more types of fluorescent bodies may also be used.

Embodiment 2

The light emission device and the illumination device according to Embodiment 2 will be described. The present embodiment differs from Embodiment 1 in that two semiconductor lasers are used. Hereinafter, the differences between the present embodiment and Embodiment 1 will be described with reference to the drawings.

Figure 7:
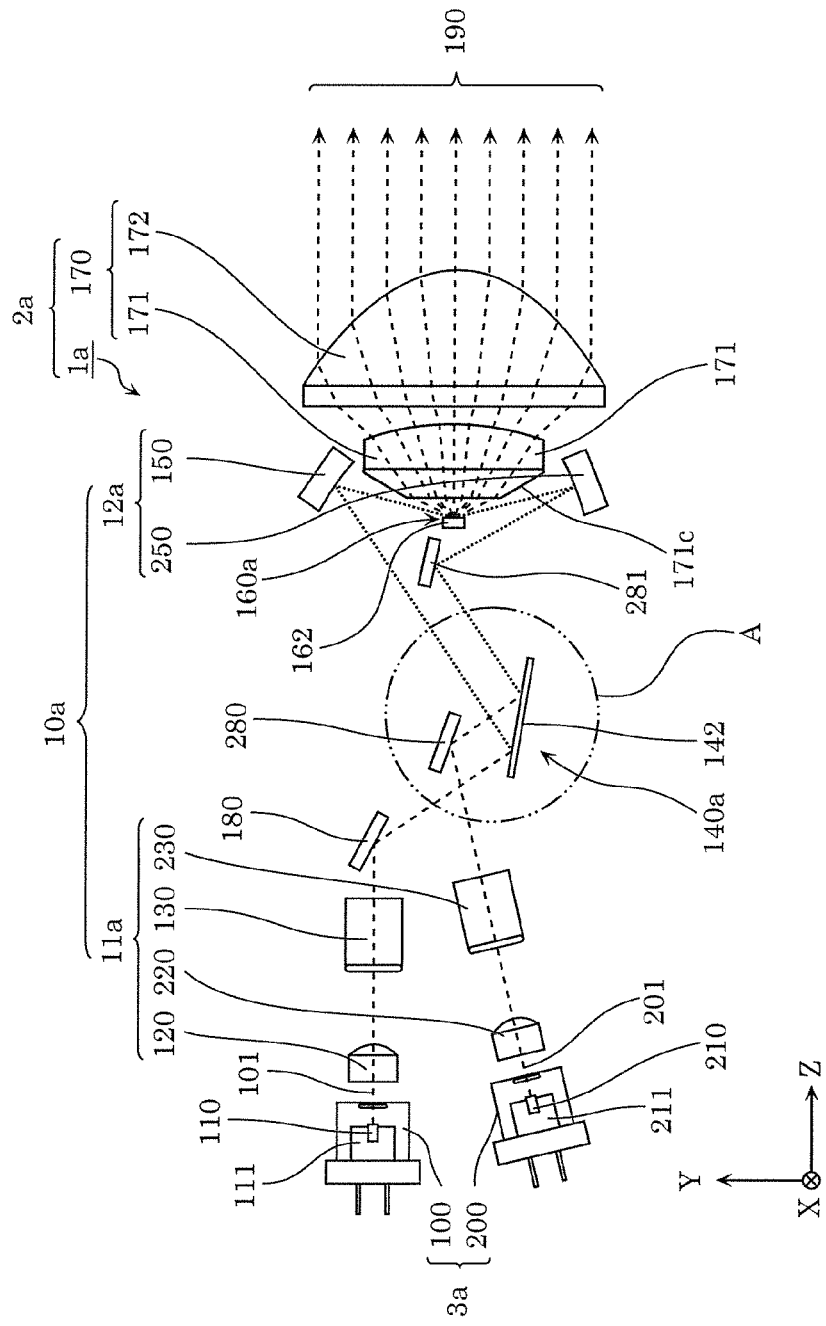
FIG. 7 is a lateral view showing an optical system configuration of the light emission device and the illumination device according to Embodiment 2.
Figure 8:
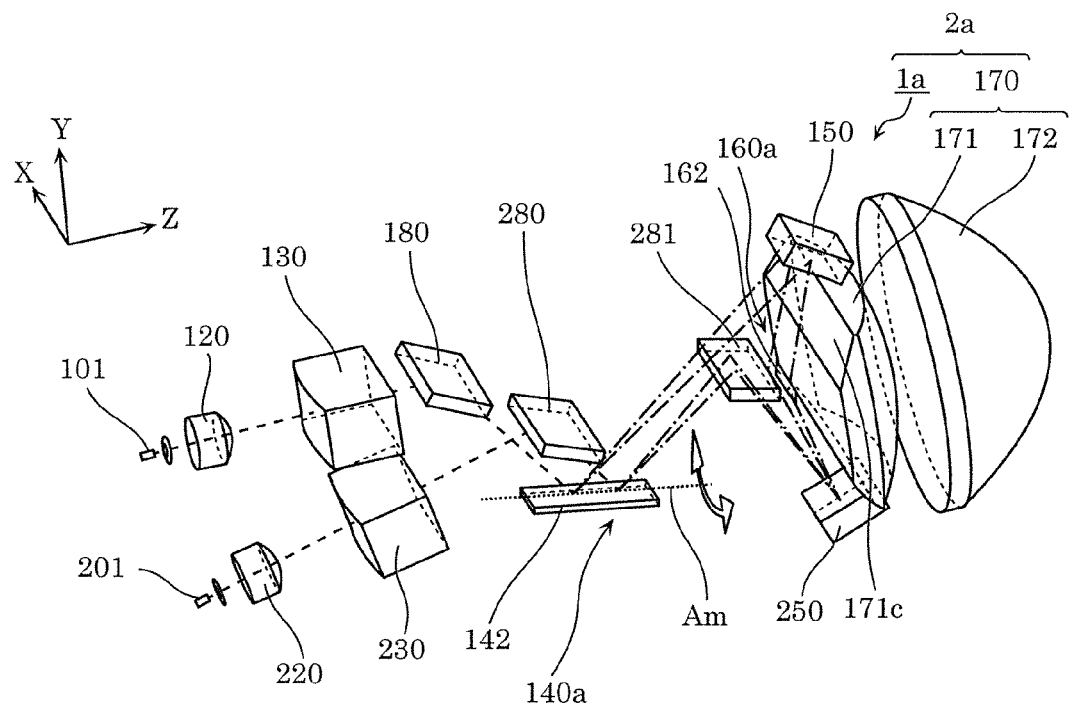
FIG. 8 is a perspective view showing the optical system configuration of the light emission device and the illumination device according to Embodiment 2.

FIGS. 7 and 8 are respectively a lateral view and a perspective view showing the optical system configuration of light emission device 1a and illumination device 2a according to the present embodiment.

As illustrated in FIGS. 7 and 8, illumination device 2a according to the present embodiment includes light emission device 1a and optical projection system 170.

Light emission device 1a includes, as illustrated in FIG. 7, light source 3a, light concentration section 10a, light deflector 140a, and wavelength converter 160a. Light emission device 1a further includes fixed mirrors 180, 280, and 281.

In the present embodiment, light source 3a includes two semiconductor lasers 100 and 200 Semiconductor laser 200 has the same configuration as semiconductor laser 100 according to Embodiment 1. In other words, semiconductor laser 200 mainly includes semiconductor light-emitting device 210 and submount 211 that is fixed to semiconductor light-emitting device 210. Note that in the present embodiment, the excitation light beams emitted from semiconductor lasers 100 and 200 are respectively referred to as first excitation light beam 101 and second excitation light beam 201.

Light concentration section 10a includes first optical system 11a and second optical system 12a. In the present embodiment, first optical system 11a includes aspheric lenses 120 and 220, and cylindrical lenses 130 and 230. Second optical system 12a includes cylindrical mirrors 150 and 250. In the present embodiment, cylindrical mirrors 150 and 250 are cylindrical concave mirrors.

Aspheric lens 220 and cylindrical lens 230 respectively have the same configuration as aspheric lens 120 and cylindrical lens 130.

Cylindrical mirrors 150 and 250 are each curved along the slow axis of semiconductor light-emitting devices 110 and 210, and have their focal points on wavelength converter 160a.

Light deflector 140a is an instrument for deflecting first excitation light beam 101 and second excitation light beam 201. Light deflector 140a includes one movable mirror 142 on which first excitation light beam 101 and second excitation light beam 201 are incident along different optical axes. In the present embodiment, movable mirror 142, for example, deflects incident light while being cyclically tilted back and forth about rotation axis Am via a magnetic circuit.

Wavelength converter 160a receives and converts excitation light beam 101 and second excitation light beam 201 deflected by light deflector 140a to wavelength-converted light of a different wavelength, and emits the wavelength-converted light. In the present embodiment, wavelength converter 160a includes fluorescent substance 162. Fluorescent substance 162 converts first excitation light beam 101 and second excitation light beam 201 to fluorescent light that is wavelength-converted light.

Fixed mirrors 180, 280, and 281 are disposed along the optical paths of first excitation light beam 101 and second excitation light beam 201, and are used for adjusting the position and propagation direction of the optical paths thereof along the slow axis.

The optical paths of first excitation light beam 101 and second excitation light beam 201 to wavelength converter 160a (in other words, fluorescent substance 162) will be described next with reference to FIGS. 7 and 8.

First excitation light beam 101 emitted from semiconductor laser 100 is incident on aspheric lens 120 disposed closely in front thereof and is converted to collimated light. Next, first excitation light beam 101 is incident on cylindrical lens 130 curved along the x-axis (fast axis of semiconductor light-emitting device 110), and first excitation light beam 101 is converted to convergent light along the fast axis. Since first excitation light beam 101 is not influenced by cylindrical lens 130 along its slow axis, first excitation light beam 101 propagates as collimated light. In the present embodiment, fixed mirror 180 is interposed along the optical path of first excitation light beam 101 in order to deflect the optical path of first excitation light beam 101 emitted from cylindrical lens 130. With this, as illustrated in FIG. 8, the optical path of first excitation light beam 101 is deflected and first excitation light beam 101 is incident on rotation axis Am of movable mirror 142. First excitation light beam 101 reflected by light deflector 140a is incident on cylindrical mirror 150 which is disposed along the reflection direction. Cylindrical lens 150 is curved along the slow axis of first excitation light beam 101, and converts first excitation light beam 101 to convergent light therealong. Here, first excitation light beam 101 is not influenced by cylindrical lens 150 along the fast axis, and propagates to wavelength converter 160a at the same convergence angle as when converted by cylindrical lens 130. First excitation light beam 101 converted to convergent light by cylindrical lens 130 and cylindrical mirror 150 is incident on wavelength converter 160a disposed proximate to the focal points of cylindrical lens 130 and cylindrical mirror 150.

Second excitation light beam 201 emitted from semiconductor laser 200 is incident on aspheric lens 220 disposed closely in front thereof and is converted to collimated light. Next, second excitation light beam 201 is incident on cylindrical lens 230 curved along the x-axis (fast axis of semiconductor light-emitting device 210), and second excitation light beam 201 is converted to convergent light along its fast axis. Since second excitation light beam 201 is not influenced by cylindrical lens 230 along the slow axis, second excitation light beam 201 propagates as collimated light. In the present embodiment, fixed mirror 280 is interposed along the optical path of second excitation light beam 201 in order to deflect the optical path of second excitation light beam 201 emitted from cylindrical lens 230. With this, as illustrated in FIG. 8, the optical path of second excitation light beam 201 is deflected and second excitation light beam 201 is incident on rotation axis Am of movable mirror 142 from the same direction and at the same angle, but at a different position than first excitation light beam 101. In other words, second excitation light beam 201 has a different optical path than first excitation light beam 101, and is incident on rotation axis Am of movable mirror 142 parallel with the optical path of first excitation light beam 101. In other words, first excitation light beam 101 and second excitation light beam 201 pass through the plane including rotation axis Am of movable mirror 142 and are incident on movable mirror 142 at the same angle.

Second excitation light beam 201 reflected by movable mirror 142 is incident on fixed mirror 281 disposed along the reflection direction, and is deflected to the opposite direction of first excitation light beam 101 relative to wavelength converter 160a. Subsequently, second excitation light beam 201 is incident on cylindrical mirror 250 disposed symmetrical to cylindrical mirror 150 with respect to the normal line passing through the center of the scan area of the incidence surface of wavelength converter 160a on which second excitation light beam 201 is incident. Here, the center of the scan area is the midpoint of the locus of the incident point on the incidence surface of wavelength converter 160a on which first excitation light beam 101 and second excitation light beam 201 are incident.

Cylindrical lens 250 is curved along the slow axis of second excitation light beam 201, and converts second excitation light beam 201 to convergent light therealong. Here, second excitation light beam 201 is not influenced by cylindrical lens 250 along the fast axis, and propagates to wavelength converter 160a at the same convergence angle as when converted by cylindrical lens 230. Excitation light beam 201 converted to convergent light by cylindrical lens 230 and cylindrical mirror 250 is incident on wavelength converter 160a disposed proximate to the focal points of cylindrical lens 230 and cylindrical mirror 250.

Fluorescent substance 162 including wavelength converter 160a partially converts first excitation light beam 101 and second excitation light beam 201 to fluorescent light that is wavelength-converted light with a broader wavelength distribution, and emits the fluorescent light outward. Moreover, the remaining light of each excitation light beam that is not converted to fluorescent light is scattered by fluorescent substance particles and fluorescent substance binder included in fluorescent substance 162, as well as particles mixed into fluorescent substance 162 when necessary, and is then emitted to the outside thereof. The fluorescent light and the scattered light from each excitation light beam is emitted perpendicularly with a Lambertian distribution with respect to the incidence surface of fluorescent substance 162 on which each excitation light beam is incident. Since people perceive the mix of fluorescent light and scattered light from each excitation light beam entering their eyes as light with a certain color depending on the ratio between fluorescent light and scattered light, the wavelength distribution of white light or any preferred color can be created by appropriately adjusting the ratio to the thickness of the fluorescent substance, the density of the fluorescent substance particles, and the like.

In the above configuration, excitation light beams 101 and 201, which are emitted respectively from semiconductor lasers 100 and 200, are incident on rotation axis Am of movable mirror 142 at two different positions from the same direction and at the same angle. In other words, first excitation light beam 101 and second excitation light beam 201 pass through the plane including rotation axis Am of movable mirror 142 and are incident on movable mirror 142 at the same angle. Furthermore, first excitation light beam 101 and second excitation light beam 201 are focused on the same coordinates on fluorescent substance 162 due to the effects of cylindrical lenses 130 and 230, and cylindrical mirrors 150 and 250. Here, cylindrical mirrors 150 and 250, fluorescent substance 162, and the like are disposed to make equal the optical path length of each excitation light beam from movable mirror 142 to the coordinates of the position where each excitation light beam is focused on fluorescent substance 162.

When light emission device 1a and illumination device 2a according to the present embodiment respectively function as the scanning light emission device and scanning illumination device, movable mirror 142, on which first excitation light beam 101 and second excitation light beam 201 are incident, cyclically rotates back and forth within a fixed angle range about rotation axis Am illustrated in FIG. 8. Consequently, each excitation light beam is scanned over the surface of fluorescent substance 162 along the x-axis while its propagation direction changes depending on the tilt angle of movable mirror 142. The range of the optical paths along which the light is scanned is illustrated with dash-dotted lines in FIG. 8. Here, the light emission width, that is the scan range, with respect to the radiation angle range as required from the illumination device can be determined based on Expr. 1-1 and Expr. 1-2. The optical systems according to the present embodiment are designed to align the x-axis coordinates on fluorescent substance 162 of first excitation light beam 101 and second excitation light beam 201 temporally and positionally.

Figure 9:
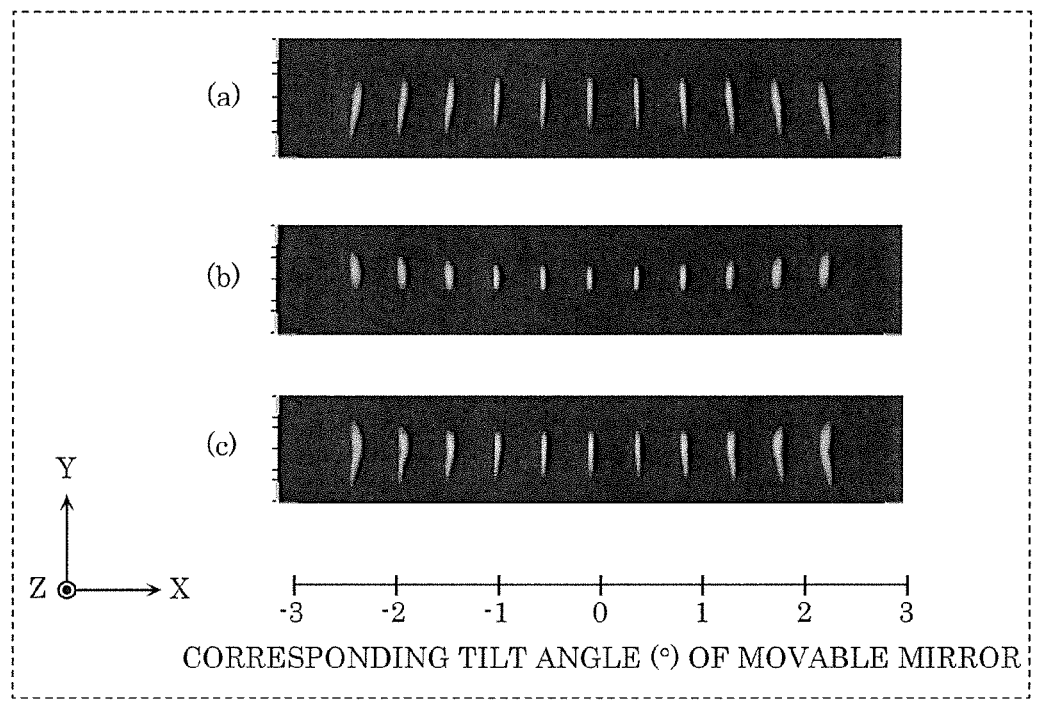
FIG. 9 shows examples of a relationship between rotation angles of a movable mirror and radiation spot shapes of the excitation light beam on the surface of the fluorescent substance in the light emission device according to Embodiment 2.

FIG. 9 shows examples of the relationship between the rotation angles of movable mirror 142 and the radiation spot shapes of excitation light beam 101 on the surface of fluorescent substance 162 in light emission device 1a according to the present embodiment. Image (a) of FIG. 9 shows the radiation spot shapes formed by first excitation light beam 101 emitted by semiconductor laser 100, and image (b) shows the radiation spot shapes formed by second excitation light beam 201 emitted by semiconductor laser 200. Moreover, image (c) shows the radiation spot shapes formed by first excitation light beam 101 and second excitation light beam 201.

As illustrated in FIG. 9, by aligning the scan time and positions of first excitation light beam 101 and second excitation light beam 201, the combined radiation spots formed by both excitation light beams are scanned on fluorescent substance 162 as one radiation spot. Therefore, by synchronizing the excitation light beams with the rotation angle of movable mirror 142 and simultaneously controlling the ON/OFF (in other words, turning the light on and off) of the beams incident on movable mirror 142, the plurality of light beams can be caused to emit and not emit light, as well as the timing thereof on the scannable area of fluorescent substance 162 by the plurality of excitation light beams. Furthermore, adjustable light distribution like ADB can be achieved since a non-radiation area can be formed within the frontward angle range corresponding to the non-emission area of fluorescent substance 162 by using Expr. 1-1 and Expr. 1-2.

Furthermore, in order to use light emission device 1a according to the present embodiment for illumination device 2a, optical projection system 170, whose combined focal point is the center scan position of fluorescent substance 162, is disposed behind the fluorescent substance with respect to the projection direction. By scanning each excitation light beam over the fluorescent substance, the fluorescent light emitted from fluorescent substance 162 with a Lambertian distribution and the scattered light from each excitation light beam is incident on optical projection system 170, and is mixed and projected in the frontward direction of the device. With this, white light mixed from fluorescent light and excitation light can be projected.

Note that in order to gather as much light emitted from fluorescent substance 162 as possible, the incidence surface of optical projection system 170 needs to be close thereto. To make sure, however, that each excitation light beam incident on fluorescent substance 162 does not come in contact with optical projection system 170, each excitation light beam is radiated on fluorescent substance 162 at a large angle and unnecessary portions of optical projection system 170 are cut away. In the present embodiment, as illustrated in FIGS. 7 and 8, a surface of first lens 171 of optical projection system 170 facing fluorescent substance 162 includes chamfer 171c on its outer edge. In other words, first lens 171 has a sloping surface because the portions of its outer edge facing fluorescent substance 162 that can possibly interfere with each excitation light beam are removed. Note that making chamfer 171c is not limited to cutting away a part of chamferless lens. For example, first lens 171 may be shaped to include chamfer 171c beforehand. In the present embodiment, incidence angle θin on fluorescent substance 162 is designed between approximately 70° and 80°. With this, an NA of 0.9 or more can be achieved for optical projection system 170.

In the present embodiment, each excitation light beam is radiated diagonally on the incidence surface of fluorescent substance 162. In other words, the incidence angle of each excitation light beam is larger than 0°. Accordingly, when the beam diameter of each excitation light beam in a cross section perpendicular to its optical axis is dy, then the spot size on fluorescent substance 162 is dy/cos θin. For example, when the incidence angle is between approximately 70° and 80°, then the magnification factor from dy is about 2.9 to 5.8 times. In order to control the light distribution of the projection light accurately, the beam diameter of each excitation light beam along the slow axis may be as small as possible since a smaller radiation spot diameter is better.

In Embodiment 2, the fast axis with good beam quality of semiconductor light-emitting devices 110 and 210 is the x-axis, and the slow axis with poor beam quality of the same is the y-axis. Therefore, both first excitation light beam 101 and second excitation light beam 201 are focused along the fast axis by cylindrical lenses 130 and 230 disposed between light deflector 140a, and semiconductor lasers 100 and 200. First excitation light beam 101 and second excitation light beam 201 pass light deflector 140a, and are focused along the slow axis by cylindrical mirrors 150 and 250 disposed behind light deflector 140a, that is near wavelength converter 160a.

With ADB in headlights for cars, among the light radiated in the movement direction of the car, an area in which the light is not radiated can be created by partially not emitting light horizontally for the purpose of preventing glare on oncoming vehicles or pedestrians due to the radiated light. Furthermore, it is desired that the positions and dimensions of the areas on which no light is shined are be altered with a fine pitch and as smoothly as possible to adjust to the driving conditions of moving cars changing moment by moment. Accordingly, a configuration in which the axis with a small spot diameter, in other words the x-axis, is aligned horizontally, which is the scan direction of the excitation light beam, is suitable for ADB. Accordingly, the horizontal direction scanned along one dimension in the present embodiment is the x-axis, and this direction is aligned with the Ax-axis with good beam quality of the semiconductor light-emitting device.

As described above, in the present embodiment, (i) the plurality of excitation light beams are radiated on rotation axis Am of movable mirror 142, (ii) the plurality of light beams are incident on one movable mirror 142 from the same direction and at the same angle, and (iii) the optical lengths of the plurality of light beams from movable mirror 142 to fluorescent substance 162 are equal. In light emission device 1a and illumination device 2a with these three features, the radiation spot movement degree on fluorescent substance 162 per unit of degree of the rotation angle of movable mirror 142 is equal for the plurality of excitation light beams. Accordingly, the plurality of excitation light beams simultaneously arrive on fluorescent substance 162 with the same coordinates on the scan axes. As a result, the plurality of excitation light beams emitted from the plurality of semiconductor lasers can be scanned while aligning their radiation positions and timing on fluorescent substance 162.

Note that in the present embodiment, two semiconductor lasers 100 and 200 are used, but as long as the conditions for the plurality of excitation light beams incident on one movable mirror 142 are met, there may also be more than two light sources. Moreover, similar results can also be produced when the plurality of excitation light beams generated are superimposed on the same axis beforehand.

Moreover, the concentration lenses used in the present embodiment are a cylindrical lens for focusing the light along the fast axis and a cylindrical mirror for focusing the light along the slow axis, but as long as the optical elements have ample light focus along one axis, the lenses may be either a lens or mirror. Moreover, fixed mirrors 180, 280, and 281 are disposed for suitably changing the propagation direction of the excitation light beams to contain their optical paths within a fixed range perpendicular thereto, but the amount of mirrors used does not matter. These may all be chosen depending on the conditions of available space, casing size restrictions, and the configuration of the optical projection system.

Variations

The light emission device and illumination device according to the present disclosure have been described above based on each of the embodiments, but the present disclosure is not limited thereto.

For example, in above Embodiment 1, aspheric lens 120 and cylindrical lens 130 are used for first optical system 11, but the present disclosure is not limited to this configuration. Only one aspheric lens may also be used for the first optical system. This configuration will be described with reference to the drawings.

Figure 10:
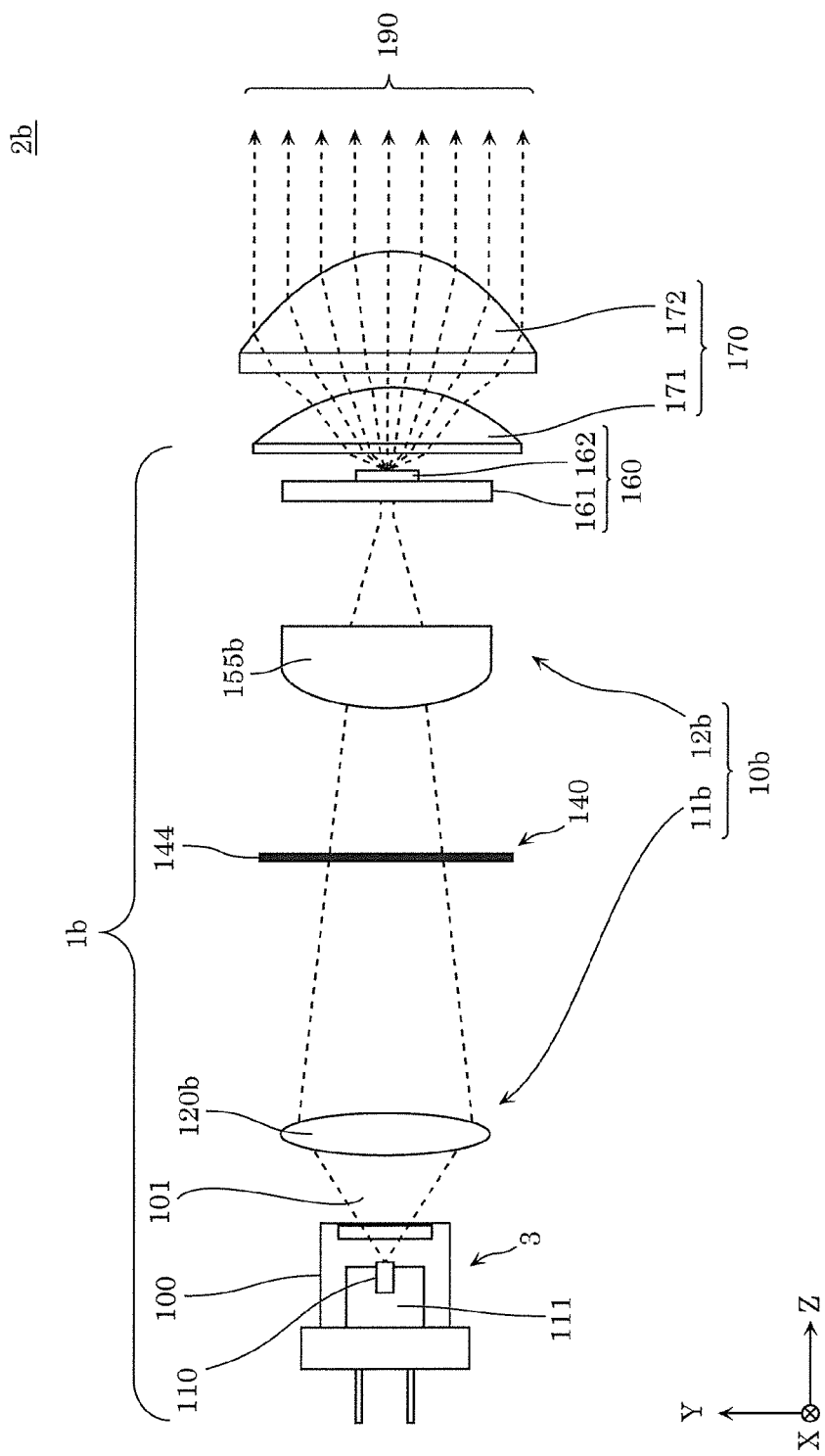
FIG. 10 is a lateral view showing a configuration of the light emission device and the illumination device according to Variation 1.
Figure 11:
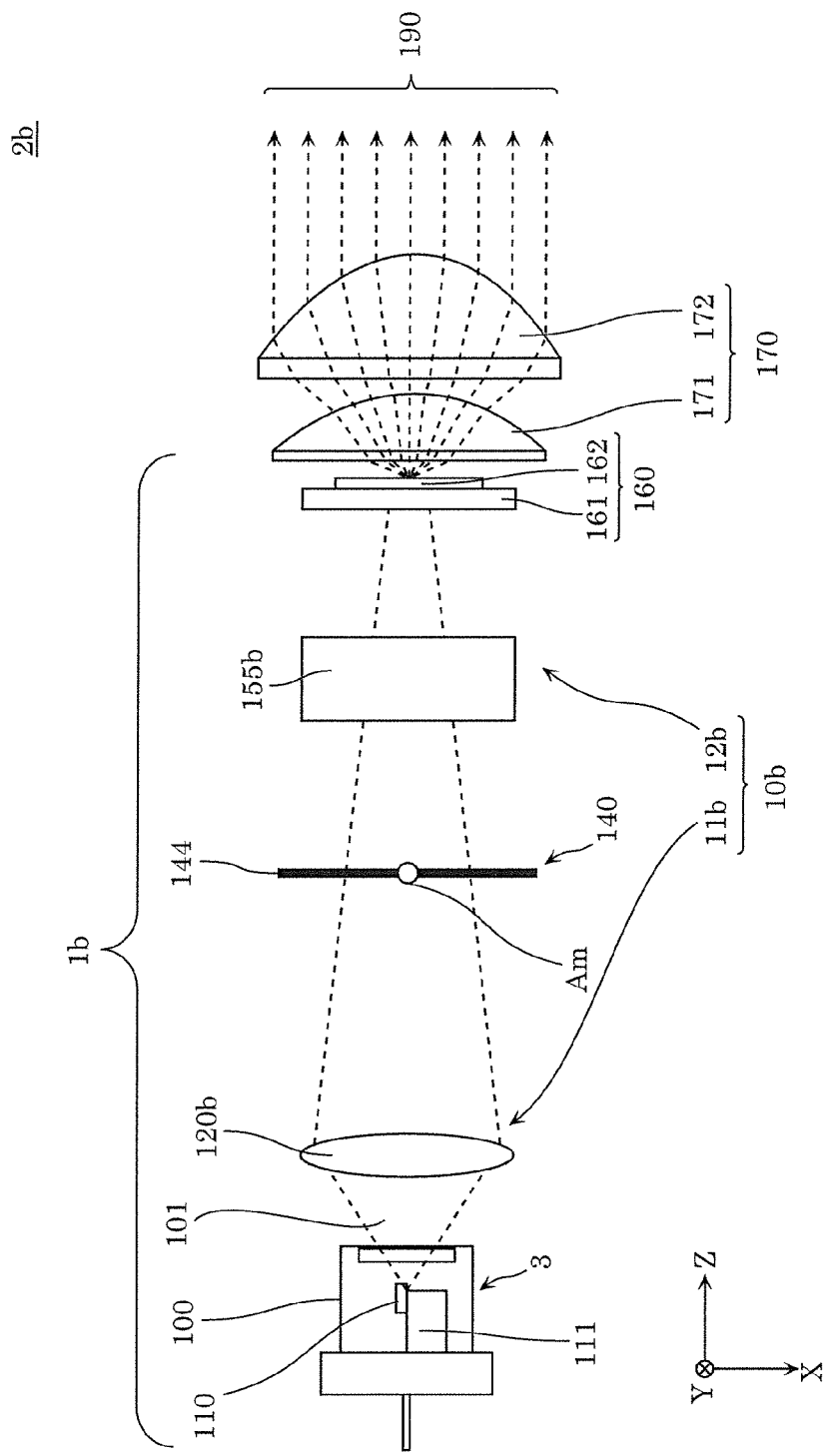
FIG. 11 is a top view showing the configuration of the light emission device and the illumination device according to Variation 1.

FIGS. 10 and 11 are respectively a lateral view and a top view showing the configuration of light emission device 1b and illumination device 2b according to Variation 1.

As illustrated in FIGS. 10 and 11, light emission device 1b according to the present variation includes light concentration section 10b. Light concentration section 10b includes first optical system 11b and second optical system 12b. First optical system 11b includes one aspheric lens 120b. With this, excitation light beam 101 is converged along both the x- and y-axes. Consequently, the focal length along the y-axis of cylindrical lens 155b included in second optical system 12b is adjusted, and the beam waist of excitation light beam 101 is located on wavelength converter 160. Light emission device 1b and illumination device 2b with this configuration produce similar results as light emission device 1 and illumination device 2 according to above Embodiment 1.

Moreover, in above Embodiment 2, two cylindrical lenses 130 and 230 curved along the fast axis for focusing first excitation light beam 101 and second excitation light beam 201 therealong are used, but one cylindrical lens 330 may also be used. Variation 2 with this configuration will be described with reference to the drawings.

Figure 12:
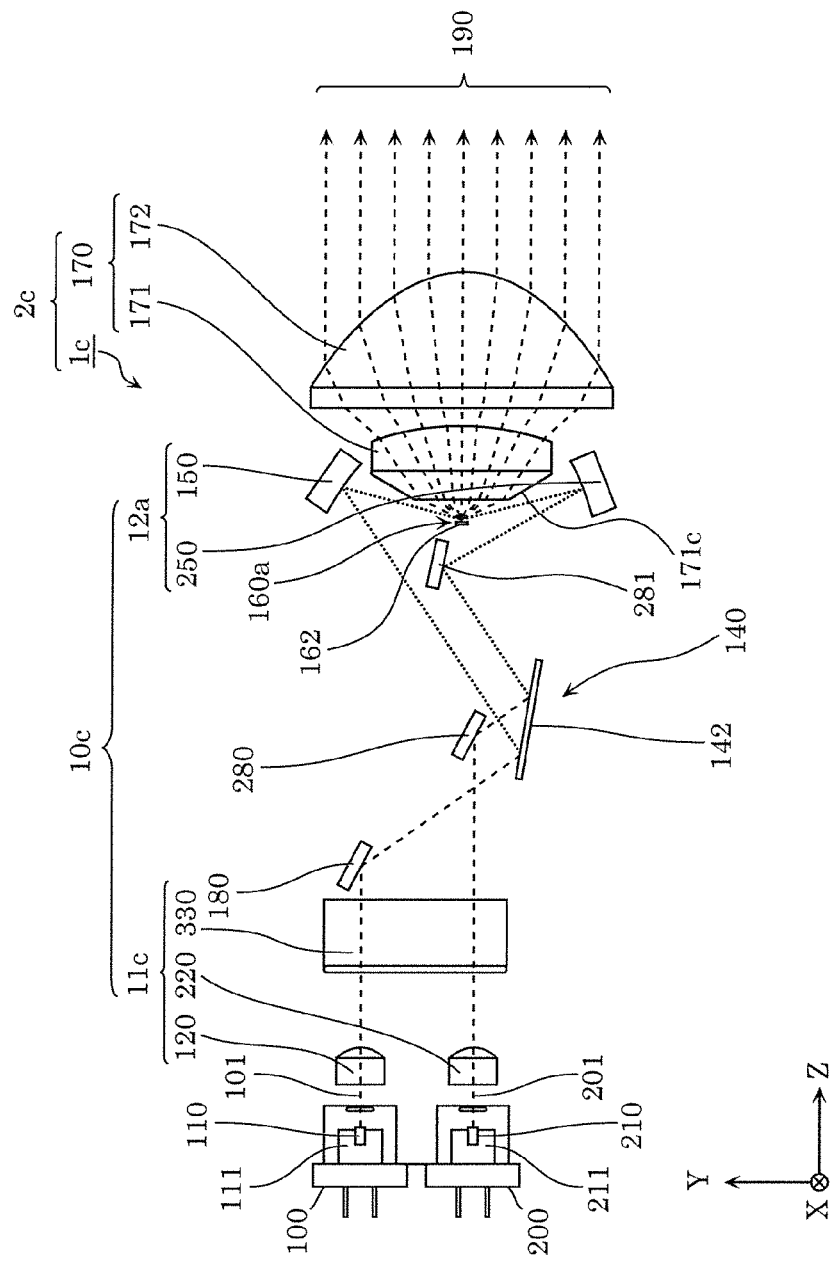
FIG. 12 is a lateral view showing a configuration of the light emission device and the illumination device according to Variation 2.

FIG. 12 is a lateral view showing the optical system configuration of light emission device 1c and illumination device 2c according to the present variation. Light emission device 1c according to the present variation includes light concentration section 10c. Light concentration section 10c includes first optical system 11c and second optical system 12a. First optical system 11c includes aspheric lenses 120 and 220, and cylindrical lens 330. Cylindrical lens 330 focuses first excitation light beam 101 and second excitation light beam 201 along the fast axis. In the present variation, both excitation light beams are incident on the same incidence surface of cylindrical lens 330 at the same angle and different positions, and determine the necessary effective diameter of cylindrical lens 330 based on the incident beam point and beam size. In this manner, the configuration of light emission device 1c and illumination device 2c can be simplified due to first excitation light beam 101 and second excitation light beam 201 being focused by one cylindrical lens 330. Moreover, adjustment work on the optical axes and the like in light emission device 1c and illumination device 2c can be reduced.

Moreover, the excitation light beams emitted from semiconductor lasers 100 and 200 are focused on the same place on fluorescent substance 162, but as long as the coordinates over which the excitation light beams are scanned along the x-axis (fast axis) are aligned, the coordinates along the y-axis (slow axis) may deviate. In this case, the light intensity distribution and projection light distribution corresponding to the combined intensity distribution can be achieved within the radiation angle range corresponding to the combined length of the two excitation light beam spots. In this case, although the brightness of projection light 190 is reduced, light saturation, thermal saturation, thermal quenching, and thermal damage can be prevented since the light density of the excitation light beams radiated on fluorescent substance 162 is not as high as when the excitation light beams are focused on the same point.

Moreover, the cylindrical lenses are disposed to have their focal point on fluorescent substance 162, but as long as the beam spots radiated on fluorescent substance 162 are on the area that reproduces the shape of the near-field pattern, the position of the cylindrical lenses may slightly deviate. The aspect ratios of the elliptic beams can be corrected slightly using this deviation.

Moreover, first excitation light beam 101 and second excitation light beam 201 are incident on aspheric lens 120 disposed closely in front of semiconductor lasers 100 and 200, and are converted to collimated light, but may also be converted to slightly converging light or slightly diverging light. In these cases, fluorescent substance 162 may be disposed at the combined focal point of the cylindrical lenses of each axis.

Moreover, in above Embodiment 2, the excitation light incidence and emission surfaces of fluorescent substance 162 are the same, but a configuration in which the excitation light beams are emitted from the other side of the incidence surface, in other words a light-transmissive configuration, may also be used. In this case, since the incidence angle of the excitation light beams on fluorescent substance 162 need not be increased to avoid optical projection system 170, the incidence angle can be configured more freely, and the configuration can be simplified.

Moreover, in the above embodiment, movable mirror 142 scans only as a line in one dimension along the x-axis (fast axis), but may also be capable of scanning in two dimensions simultaneously by adding the y-axis. In this case, the direction necessary for scanning more minutely or the direction in which the radiation range is wider, for example the horizontal radiation direction in ADB, is disposed so that this direction becomes the axis with good beam quality, in other words the fast axis of the laser light.

Moreover, optical projection system 170 in the illumination device of each above embodiment includes two lenses, but this number may be increased for correcting chromatic aberration or surface curvature. Only one lens may also be used when the illumination device is not used much and a slight radiation blur does not pose a problem. A reflector (reflection mirror) may also be used. For example, when the reflector is a paraboloid of revolution, the fluorescent light generated from fluorescent substance 162 with a Lambertian distribution and the scattered light from the excitation light beams can be emitted further in a predetermined direction as substantially collimated light by disposing fluorescent substance 162 on the focal point of the reflector.

Moreover, in the present embodiment, the light deflector is a movable mirror driven by a magnetic circuit, but as long as the movable mirror can be tilted back and forth, a microelectromechanical system (MEMS) mirror driven by piezoelectricity, or a polygon or galvano mirror using a motor, another method may also be used.

Moreover, in the above embodiments, fluorescent substance 162 is disposed on the wavelength converter, but any other wavelength conversion element may also be used.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure provides an illumination device with adjustable light distribution which has high brightness and resolution and includes a function in which a specific area is radiated or not radiated with light tracking the movements of an illumination target, such as headlights for cars with ADB, spotlights that track an illumination target, and searchlights.

What is claimed is:
1. A light emission device, comprising:
a light source that emits an excitation light beam;
a light deflector that deflects the excitation light beam;
a wavelength converter that receives and converts the excitation light beam deflected by the light deflector to wavelength-converted light of a different wavelength, and emits the wavelength-converted light; and
a light concentration section that focuses the excitation light beam on the wavelength converter, wherein
the light concentration section includes a first optical system disposed between the light source and the light deflector, and a second optical system disposed between the light deflector and the wavelength converter, and
in the second optical system, a focal length of an Ay-axis is shorter than a focal length of an Ax-axis,
where the Ax-axis is defined as an axis that has a lowest beam parameter product of the excitation light beam, and the Ay-axis is defined as an axis orthogonal to the Ax-axis in a cross section perpendicular to a propagation direction of the excitation light beam.

2. The light emission device according to claim 1, wherein the second optical system includes a cylindrical lens or a cylindrical mirror.

3. The light emission device according to claim 1, wherein respective combined focal lengths fx and fy of the Ax-axis and the Ay-axis of the light concentration section satisfy fx>fy.

4. The light emission device according to claim 1, wherein the excitation light beam is scanned on the wavelength converter along the Ax-axis.

5. The light emission device according to claim 1, wherein the excitation light beam is scanned on the wavelength converter along the Ax-axis and the Ay-axis, and over a wider angle along the Ax-axis than the Ay-axis.

6. The light emission device according to claim 1, wherein the wavelength converter is a fluorescent substance.

7. An illumination device, comprising:
the light emission device according to claim 1; and
an optical projection system for radiating on an illumination target (i) the wavelength-converted light emitted from the wavelength converter that receives the excitation light beam, and (ii) light scattered from the excitation light beam by the wavelength converter.

* * * * *